United States Patent
Li et al.

(10) Patent No.: US 11,901,872 B2
(45) Date of Patent: Feb. 13, 2024

(54) THIN FILM BULK ACOUSTIC RESONATOR AND MANUFACTURING PROCESS THEREFOR

(71) Applicant: JWL (ZHEJIANG) SEMICONDUCTOR CO., LTD., Zhejiang (CN)

(72) Inventors: Linping Li, Zhejiang (CN); Jinghao Sheng, Zhejiang (CN); Zhou Jiang, Zhejiang (CN)

(73) Assignee: JWL (ZHEJIANG) SEMICONDUCTOR CO., LTD. (CN)

( * ) Notice: Subject to any disclaimer, the term of this patent is extended or adjusted under 35 U.S.C. 154(b) by 0 days.

(21) Appl. No.: 18/007,994

(22) PCT Filed: Jun. 28, 2020

(86) PCT No.: PCT/CN2020/098557
§ 371 (c)(1),
(2) Date: Dec. 2, 2022

(87) PCT Pub. No.: WO2021/248572
PCT Pub. Date: Dec. 16, 2021

(65) Prior Publication Data
US 2023/0208383 A1 Jun. 29, 2023

(30) Foreign Application Priority Data
Jun. 9, 2020 (CN) .......... 202010526851.5

(51) Int. Cl.
*H03H 9/02* (2006.01)
*H03H 3/02* (2006.01)
(Continued)

(52) U.S. Cl.
CPC .......... *H03H 9/02125* (2013.01); *H03H 3/02* (2013.01); *H03H 9/133* (2013.01);
(Continued)

(58) Field of Classification Search
CPC ....... H03H 9/02015; H03H 9/173; H03H 9/53
See application file for complete search history.

(56) References Cited

U.S. PATENT DOCUMENTS 7,737,806 B2 6/2010 Taniguchi et al.
8,330,325 B1 12/2012 Burak et al.
(Continued)

FOREIGN PATENT DOCUMENTS

CN 1595799 A 3/2005
CN 101309074 A 11/2008
(Continued)

OTHER PUBLICATIONS

Office Action dated Jun. 20, 2023 in counterpart Japanese Application No. 2022-574755.

*Primary Examiner* — Bryan P Gordon
(74) *Attorney, Agent, or Firm* — The Belles Group, P.C.

(57) ABSTRACT

A thin film bulk acoustic resonator and a method for manufacturing the same. The thin film bulk acoustic resonator comprises a bottom electrode layer, a piezoelectric layer, and a top electrode layer, which are disposed on a substrate in which an acoustic reflection structure is located, where a portion which is of the piezoelectric layer and corresponds to a boundary of the acoustic reflection structure is depolarized to form a depolarized portion. The method comprises providing a bottom electrode layer on a substrate to cover an acoustic reflection structure which is formed or to be formed on the substrate; providing a piezoelectric layer on the bottom electrode layer; depolarizing a portion, which is of the piezoelectric layer and corresponds to a boundary of the acoustic reflection structure, to form a depolarized portion; and providing a top electrode layer on the piezoelectric layer.

16 Claims, 6 Drawing Sheets

(51) Int. Cl.
    *H03H 9/13*         (2006.01)
    *H03H 9/17*         (2006.01)
    *H03H 9/54*         (2006.01)

(52) U.S. Cl.
    CPC ............... *H03H 9/173* (2013.01); *H03H 9/54* (2013.01); *H03H 2003/021* (2013.01)

(56) References Cited

U.S. PATENT DOCUMENTS

| | | |
|---|---|---|
| 10,720,900 B2 | 7/2020 | Lee et al. |
| 2005/0057324 A1 | 3/2005 | Onishi et al. |
| 2008/0284543 A1 | 11/2008 | Taniguchi et al. |
| 2012/0319530 A1 | 12/2012 | Burak et al. |
| 2016/0197593 A1 | 7/2016 | Hurwitz et al. |
| 2018/0013401 A1* | 1/2018 | Lee ................. H03H 9/173 |
| 2018/0183405 A1* | 6/2018 | Feng ................. H03H 3/02 |
| 2018/0269847 A1 | 9/2018 | Binder et al. |
| 2018/0309425 A1 | 10/2018 | Shealy et al. |
| 2020/0083861 A1 | 3/2020 | Matsuo et al. |

FOREIGN PATENT DOCUMENTS

| | | |
|---|---|---|
| CN | 108173531 A | 6/2018 |
| CN | 108574473 A | 9/2018 |
| CN | 109546985 A | 3/2019 |
| CN | 110767606 A | 2/2020 |
| CN | 110896302 A | 3/2020 |
| IN | 107800396 A | 3/2018 |
| JP | 2005110230 A | 4/2005 |
| JP | 2013005446 A | 1/2013 |
| JP | 2018007230 A | 1/2018 |
| WO | 2019129979 A | 7/2019 |

\* cited by examiner

THIN FILM BULK ACOUSTIC RESONATOR AND MANUFACTURING PROCESS THEREFOR

This application is the national phase of International Application No. PCT/CN2020/098557, titled "THIN FILM BULK ACOUSTIC RESONATOR AND MANUFACTURING PROCESS THEREFOR", filed on Jun. 28, 2020, which claims the priority to Chinese Patent Application No. 202010526851.5, titled "THIN FILM BULK ACOUSTIC RESONATOR AND MANUFACTURING PROCESS THEREFOR", filed on Jun. 9, 2020 with the China National Intellectual Property Administration. The disclosures of the aforementioned priority applications are incorporated herein by reference in their entireties.

FIELD

The present disclosure relates to the field of communication devices, and in particular to a thin film bulk acoustic resonator and a method for manufacturing the same.

BACKGROUND

The electromagnetic spectrum becomes increasingly crowded, and wireless communication devices are provided with more and more frequency bands and functions. The electromagnetic spectrum for wireless communications is expanding rapidly from 500 MHz to 5 GHz and even higher, and consequently there is an increasing demand for radio-frequency (RF) front-end modules having high performances, low costs, low power consumption, and a small dimension. A filter is one of the RF front-end modules and is capable of improving quality of signals that are transmitted and received. The filter is mainly formed by multiple resonators connected based on a topology network. The thin-film bulk acoustic resonator (FBAR) is a type of bulk acoustic resonators, a filter formed by the FBARs is advantageous in a small dimension, a strong capability of integration, a high quality factor Q under a high frequency, and strong power endurance, and hence serves as a core device at the RF front end.

The FBAR has a basic structure including an upper electrode, a lower electrode, and a piezoelectric layer sandwiched between the upper electrode and the lower electrode. A main function of the piezoelectric layer is achieving conversion between electrical energy and mechanical energy. When an electrical field is applied between the upper electrode and the lower electrode of the FBAR, the piezoelectric layer converts electrical energy into mechanical energy, which exists in a form of acoustic waves. The acoustic wave vibrates in two modes, i.e., the transverse wave and the longitudinal wave. The longitudinal wave is the major mode during operation of the FBAR, and the transverse wave is apt to leak from an edge of the resonator and causing energy dissipation. The Q factor is an important measurement of performances of a resonator, and is equal to a ratio of energy stored in the resonator to energy dissipating from the resonator. Therefore, the energy dissipating with the transverse reduces the Q factor wave and degrades device performances.

In conventional technology, an air gap located at a boundary of a cavity is configured to reflect transverse waves to restrain the energy dissipation. The air gap is fabricated through removing an internal sacrificial layer at the boundary of the cavity. Such process is complicated, and requires high mechanical stability on an interconnecting portion of the top electrode above the cavity. As another means, staggered electrodes are configured above an effective resonating region of the resonator, which can suppress parasitic oscillation to some extent but cannot prevent the energy dissipation due to the transverse wave. As another means, grooves are formed on the piezoelectric layer to restrain the energy dissipation due to the transverse waves, and thereby improves the Q factor. The grooves are fabricated through etching, which would induce lattice defects and micro-pores in the piezoelectric layer at a bottom and side walls of the grooves, and thus affects the performance of the resonator. The piezoelectric layer above a boundary of the cavity would inherit the lattice defects and micro-pores formed through etching the bottom electrode. Moreover, such means reduces an area of the resonating region above the cavity, which increases a size of the filter to some extent. As another means, discontinuity of acoustic impedance is provided through a mass loading layer on the top electrode, and restrain the energy dissipation due to the transverse wave.

SUMMARY

In conventional technology, a transverse wave at a resonating region is apt to leak from an edge of the resonator in a resonating region above cavity, and parasitic oscillation is difficult to suppress, which degrades device performances. In order to address such technical issue, a thin film bulk acoustic resonator and a method for manufacturing the same is provided according to embodiments of the present disclosure.

In a first aspect, a thin film bulk acoustic resonator is provided. The thin film bulk acoustic resonator includes a bottom electrode layer, a piezoelectric layer, and a top electrode layer, which are disposed on a substrate in which an acoustic reflection structure is located, where a portion which is of the piezoelectric layer and corresponds to a boundary of the acoustic reflection structure is depolarized to form a depolarized portion. The depolarized portion is capable to restrain energy within a resonating region of the resonator from dissipating via a transverse wave. Hence, an intensity of a mechanical vibration in the resonating region is ensured, and parasitic oscillation is suppressed, which improves a Q factor of the resonator.

In some embodiments, the depolarized portion is partially depolarized. The partial depolarization is configured based on a requirement on device performances, which can facilitate manufacturing a device that meets the expected performance requirement with a minimum cost.

In some embodiments, the depolarized portion is completely depolarized. The complete depolarization of the depolarized portion can achieve maximum isolation and a minimum parasitic effect.

In some embodiments, a projection of the depolarized portion on the substrate extends at least from a region outside the acoustic reflection structure to a region inside the acoustic reflection structure. Such arrangement is capable to restrain the energy in the resonator better from dissipating via the transverse wave.

In some embodiments, the depolarized portion is formed through selective depolarization on the piezoelectric layer. The selective depolarization facilitates control on the depolarization.

In some embodiments, the depolarization includes ion implantation and annealing which are performed on a piezoelectric material of the piezoelectric layer. The ion implantation enables depolarizing the piezoelectric layer through various annealing techniques.

In some embodiments, the resonator includes multiple sub-resonators disposed on the same substrate, where the piezoelectric layer in a region between adjacent ones of the multiple sub-resonators is depolarized. Such arrangement can achieve an overall suppression of parasitic oscillation.

In some embodiments, the acoustic reflection structure is a cavity. The cavity can enhance reflection of acoustic waves and improve the Q factor of the device.

In some embodiments, the acoustic reflection structure is a Bragg reflection structure.

In a second aspect, a method for manufacturing a thin film bulk acoustic resonator is provided. The method includes: S1, providing a bottom electrode layer on a substrate to cover an acoustic reflection structure which is formed or to be formed on the substrate; S2, providing a piezoelectric layer on the bottom electrode layer; S3, depolarizing a portion, which is of the piezoelectric layer and corresponds to a boundary of the acoustic reflection structure, to form a depolarized portion; and S4, providing a top electrode layer on the piezoelectric layer.

The portion of the piezoelectric layer corresponding to the boundary of the acoustic reflection structure is depolarized to form the depolarized portion, and hence it is capable to restrain energy in a resonating region of the resonator from dissipating via a transverse wave. Thereby, an intensity of a mechanical vibration in the resonating region is ensured, and parasitic oscillation is suppressed, which improves a Q factor of the resonator.

In some embodiments, the step S3 specifically includes: S31, depositing a hard mask or coating a photoresist on the piezoelectric layer; S32, patterning the hard mask or the photoresist to expose at least the portion of the piezoelectric layer; S33, performing ion implantation on the exposed portion of the piezoelectric layer; and S34, removing the hard mask or the photoresist.

In some embodiments, the step S33 further includes annealing the piezoelectric layer after the ion implantation. Piezoelectricity of the piezoelectric layer can be eliminated through the annealing.

In some embodiments, the step S33 specifically includes: controlling one or both of a type and concentration of ions implanted during the ion implantation, where a Curie point of a material of the piezoelectric layer after the ion implantation is lower than a highest temperature in all processes for manufacturing the resonator subsequent to the ion implantation. In such case, the type and/or the concentration of implanted ions can be determined appropriately based on the highest processing temperature, such that the depolarization can meet a requirement of various processing temperatures.

In some embodiments, the acoustic reflection structure is a cavity or a Bragg reflection structure. The acoustic reflection structure may be provided as the cavity or the Bragg reflection structure based on different applications.

In a third aspect, a thin film bulk acoustic resonator is provided. The thin film bulk acoustic resonator is manufactured through the forgoing.

According to embodiments of the present disclosure, the piezoelectric layer in a specific region of the thin film bulk acoustic resonator is depolarized and thus has no piezoelectricity. Thereby, parasitic oscillation is suppressed, and the energy is strained from dissipating via transverse waves, which improves the Q factor and device performances. Such technical solution is simpler and has fewer requirements on mechanical stability of an interconnecting portion of the top electrode, in comparison with a conventional means which utilizes an air gap and other designs to reflect the transverse wave and restrain the energy dissipation. In addition, in the method for manufacturing the thin film bulk acoustic resonator, the exposed portion of the piezoelectric layer is subject to the ion implantation and then the annealing process, so that the portion of the piezoelectric layer corresponding to the boundary of the acoustic reflection structure forms the depolarized portion. The portion may be partially or completely depolarized depending on requirements on performances and a cost of devices operating in different frequency bands. Thereby, the thin film bulk acoustic resonators having different costs or performances can be manufactured.

BRIEF DESCRIPTION OF THE DRAWINGS

Drawings are included herein to provide further understanding of embodiments and are incorporated herein to constitute a part of this specification. The drawings illustrate embodiments of the present disclosure and explain the principles of the present disclosure in conjunction with description. Various advantages of these embodiments as well as other embodiments may refer to following detailed description and hence can be well understood. Elements in the drawings may not be depicted in scale. Identical numerals represent corresponding parts which are similar.

DETAILED DESCRIPTION

Hereinafter the present disclosure is further illustrated in detail with reference to the drawings and embodiments. It should be understood that specific embodiments described herein are merely intended for explaining related solutions, rather than limiting the present disclosure. It is noted that only components related to solutions are depicted in the drawings to facilitate description.

Embodiments of the present disclosure and features in the embodiments may be combined with each other as long as there is no conflict. Hereinafter the present disclosure is described in detail with reference to the drawings in conjunction with the embodiments.

Figure 1:
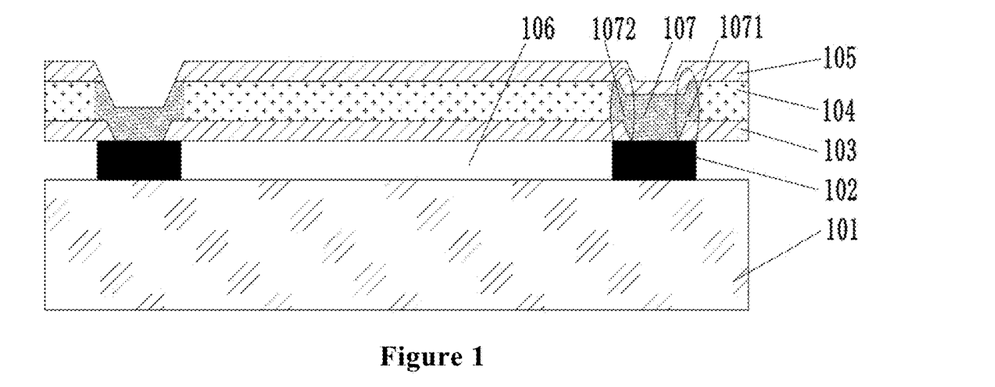
FIG. 1 shows a sectional view of a thin film bulk acoustic resonator according to an embodiment of the present disclosure.

FIG. 1 shows a sectional view of a thin film bulk acoustic resonator according to an embodiment of the present disclosure. As shown in FIG. 1, the thin film bulk acoustic resonator includes a substrate 101, a support layer 102, a bottom electrode 103, a piezoelectric layer 104, and a top electrode 105. The support layer 102 connects the substrate 101 and the bottom electrode 103, and forms a cavity 106 between the substrate 101 and the bottom electrode 103. A vertical region, which is in the piezoelectric layer 104 and the electrodes and outside the cavity 106, is depolarized to form a depolarized piezoelectric layer 107. The depolarized piezoelectric layer 107 is capable of restraining energy from dissipating from the resonator via transverse waves, thereby increasing the Q factor of the device. In a preferable embodiment, the depolarized piezoelectric layer 107 may be completely depolarized or partially depolarized. The partial depolarization may be performed based on a requirement on device performances, which facilitates manufacturing a device that meets the requirement with a minimum cost. The complete depolarization can achieve maximum isolation and a minimum parasitic effect.

In a specific embodiment, a projection of the depolarized piezoelectric layer 107 on the substrate 101 may extends from a region outside the cavity 106 to an edge of the cavity 106, or to a region inside the cavity. The depolarized piezoelectric layer 107 is formed through selective depolarization which is performed on the piezoelectric layer 104. The depolarization includes ion implantation and annealing on a piezoelectric material in the piezoelectric layer 104. The depolarized piezoelectric layer 107 is capable to restrain the energy in the resonator better from dissipating via transverse waves. The ion implantation can enable utilization of various annealing techniques to implement depolarization of the piezoelectric layer 104, and thereby facilitates control on the depolarization.

Typically, a right side of the top electrode 105 extends outward from the thin film bulk acoustic resonator in some specific embodiments. The vertical region, which is in the piezoelectric layer 104 and the electrodes and outside the cavity 106, may generate parasitic oscillation and hence affect device performances. The parasitic oscillation may be suppressed through eliminating piezoelectricity of the piezoelectric layer in such region. The bottom electrode 103 is subject to lattice defects and micro-pores after being etched, and the piezoelectric layer 104 would inherit such defects vertically during film formation. The defects of the piezoelectric layer 104 would scatter the transverse waves and hence results in energy dissipation. The depolarized piezoelectric layer 107 is capable to prevent the energy dissipation due to the defects in the piezoelectric layer 104. Hence, no matter whether the top electrode 105 extends outward or not, the depolarized piezoelectric layer 107 can strain the energy from dissipating from the resonator via transverse waves, and improve the Q factor of the device.

In a specific embodiment, multiple resonators are connected in parallel on the same substrate (which is only partially indicated at a right side of the resonator as shown in FIG. 1). The top electrode 105 of the current resonator is connected to the top electrode of a next resonator. In such case, the region 1071 and the region 1072 should be configured as the depolarized piezoelectric layer 107, so as to suppress parasitic oscillation and improve device performances.

In conventional technology, an air gap is formed through removing an internal sacrificial layer at a boundary of a cavity boundary, so as to reflect transverse waves, which is complex and requires high mechanical stability of an interconnecting portion of the top electrode above the cavity. In comparison with such solution, herein the effect of restraining the energy from dissipating via the transverse waves is implemented via eliminating piezoelectricity of the piezoelectric layer at the boundary of the cavity, which is simpler and has a lower requirement on the mechanical stability of the interconnecting portion of the top electrode.

Figure 2:
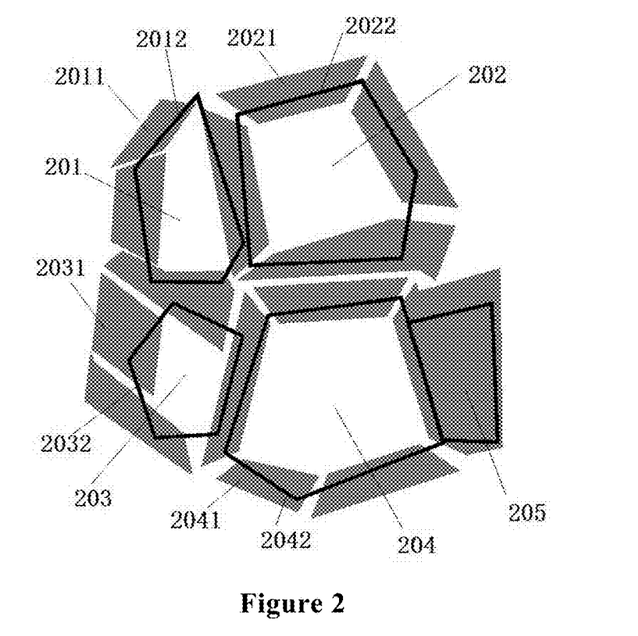
FIG. 2 shows a top view of a filter according to an embodiment of the present disclosure.

FIG. 2 shows a top view of a filter according to a specific embodiment of the present disclosure. As shown in FIG. 2, the filter includes four resonators, i.e., 201, 202, 203, and 204, and a connecting plate 205. In the resonators (201, 202, 203, and 204), supporting layers 2011, 2021, 2031, and 2041 and electrodes 2012, 2022, 2032, and 2042 may be provided in any shape, which depends on a shape of the filter. The connecting plate 205 serves as an interconnecting portion for the electrode 2042 of the resonator 204. Cavities of the four resonators are communicated with a region outside the resonators, so that edges may be released through channels that are connected to each other. Thereby, the cavities can be formed without damaging the piezoelectric layer at the edges among the resonators, which improves device performances.

Figure 3:
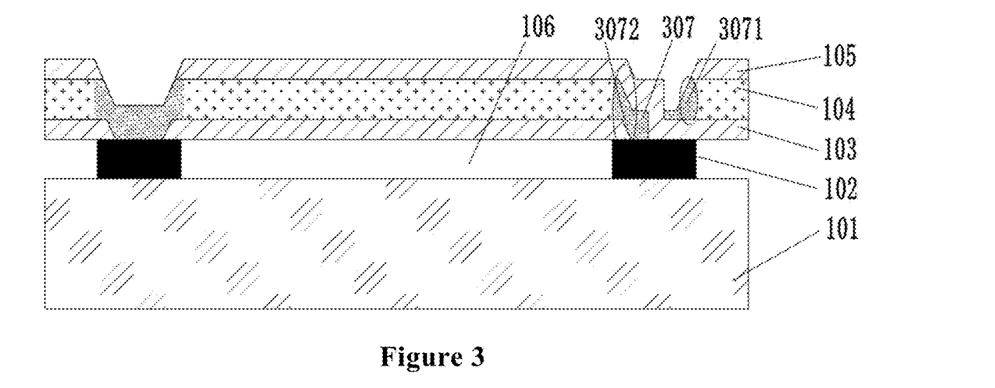
FIG. 3 shows a sectional view of a thin film bulk acoustic resonator in serial connection according to an embodiment of the present disclosure.

Reference is made to FIG. 3, which shows a sectional view of a thin film bulk acoustic resonator in serial connection according to an embodiment of the present disclosure. As shown in FIG. 3, a top electrode 105 of the current resonator is connected with a bottom electrode 103 of a next resonator, so as to implement the serial connection. Depolarized piezoelectric layers 307 are provided on the piezoelectric layers 104, respectively, at where the two resonators are connected in series. The region 3071 and the region 3072 should be configured as the depolarized piezoelectric layer 307. There would be parasitic oscillation affecting device performances without the depolarization piezoelectric layer 307.

Figure 4:
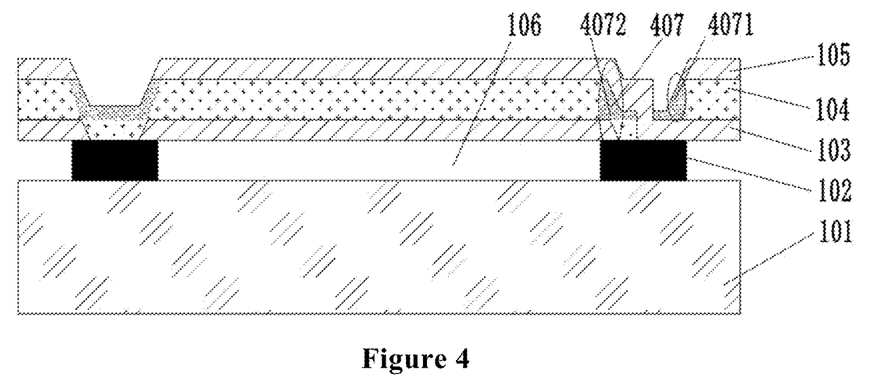
FIG. 4 shows a sectional view of a thin film bulk acoustic resonator which is partially polarized in serial connection according to an embodiment of the present disclosure.

In another specific embodiment, a larger area occupied by the depolarized piezoelectric layer leads to an improvement of the device performances, but results in a higher cost. Therefore, a range of the depolarized piezoelectric layer may be adjusted based on a cost and a device performance. As an example, FIG. 4 shows a sectional view of a thin film bulk acoustic resonator which is partially polarized in serial connection according to a specific embodiment. The region 4071 and the region 4072 should be configured as the depolarized piezoelectric layer 407, which is also capable to achieve the technical effect of restraining the energy from dissipating from the resonator via the transverse waves and suppressing parasitic oscillation.

Figure 5:
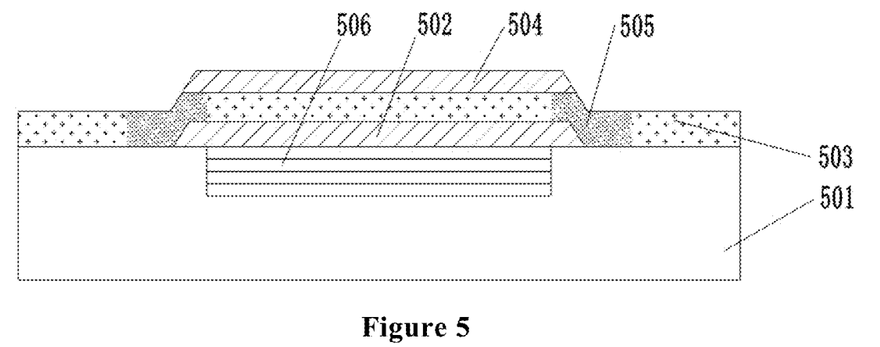
FIG. 5 shows a sectional view of a thin film bulk acoustic resonator of an SMR structure according to an embodiment of the present disclosure.

FIG. 1 to FIG. 3 show solutions of the depolarized piezoelectric layer in the resonator having a cavity. It should be appreciated that the structure concerning the depolarized piezoelectric layer is also applicable to a solidity-mounted resonator (SMR) structure, which can also achieve technical effects of embodiments of the present disclosure. FIG. 5 shows a sectional view of a thin film bulk acoustic resonator of an SMR structure according to another embodiment of the present disclosure. As shown in FIG. 5, the thin film bulk acoustic resonator of the SMR structure includes a substrate 501, a bottom electrode 502, a piezoelectric layer 503, and a top electrode 504. A Bragg reflection structure 506 is disposed on the substrate 501. A depolarized piezoelectric layer 505 is disposed at two ends of the piezoelectric layer 503 above a reflecting region of the Bragg reflection structure 506. Such structure can also achieve the technical effect of restraining the energy in the resonator from dissipating via the transverse waves.

FIG. 6 shows schematic structural diagrams in a processing flow of a method for manufacturing a thin film bulk acoustic resonator according to an embodiment of the present disclosure. As shown in FIG. 6, the method includes processes as follows.

Figure 6A:
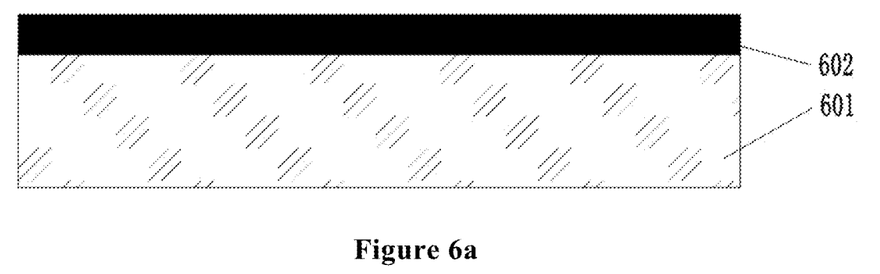
FIG. 6a to FIG. 6o show schematic structural diagrams of a processing flow for manufacturing a thin film bulk acoustic resonator according to an embodiment of the present disclosure.
Figure 6B:
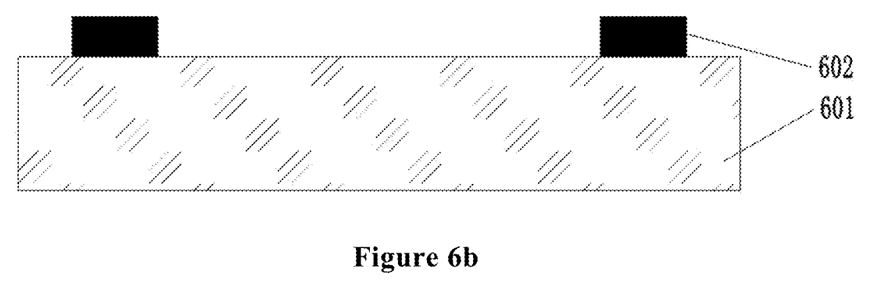
Figure 6C:
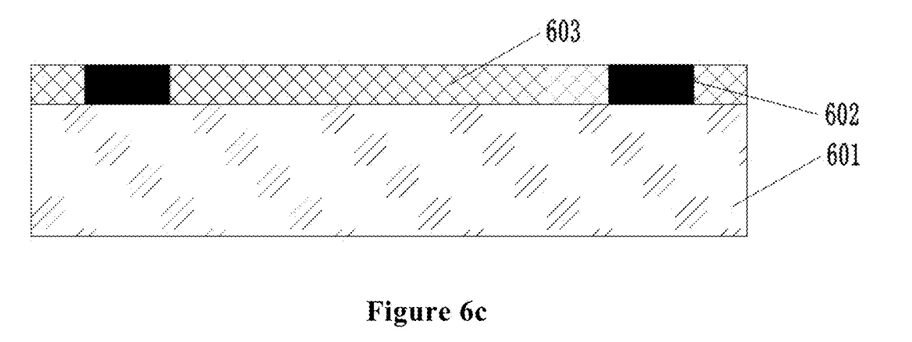
Figure 6D:
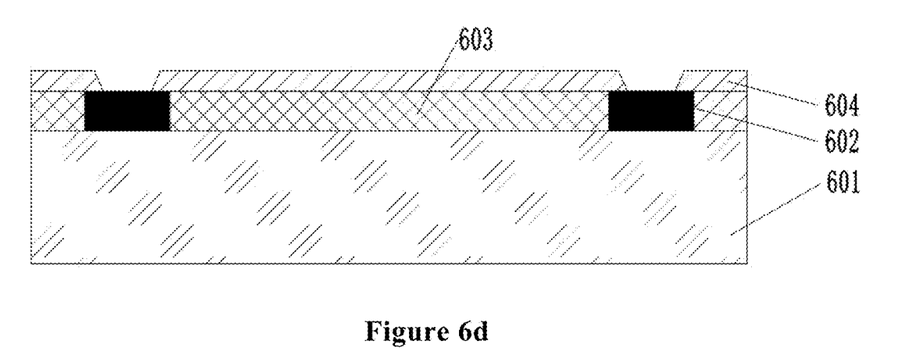
Figure 6E:
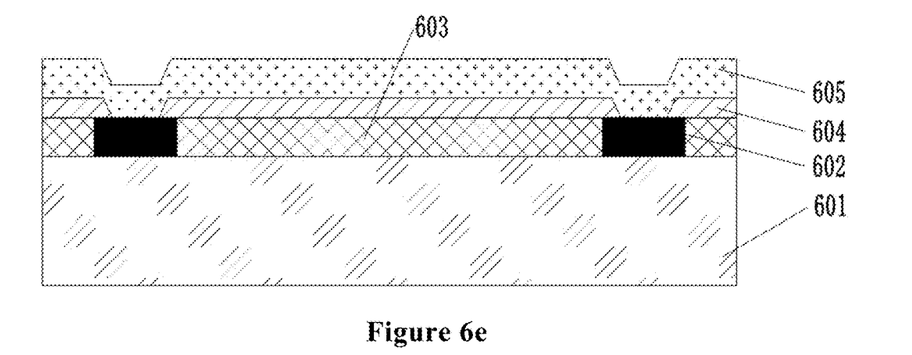

Reference is made to FIG. 6a. First, a silicon layer 602 is grown on a substrate 601. The substrate 601 may be made of Si, SiC, sapphire, spinel, or the like. In a preferable embodiment, the silicon layer is grown through physical vapor deposition (PVD) and has a thickness ranging from 1.5 μm to 3 μm. A required pattern of the cavity of the resonator is formed on the silicon layer 602 through photolithography, as shown in FIG. 6b. A sacrificial layer 603 is grown in the cavity and then subject to chemical-mechanical polishing, as shown in FIG. 6c. The sacrificial layer may be made of phosphosilicate glass (PSG, p-doped $SiO_2$). A bottom electrode 604 is provided on the silicon layer 602 and the sacrificial layer 603, and the bottom electrode 604 may be made of molybdenum. A piezoelectric layer 605 is provided on a basis of the bottom electrode 604, and the piezoelectric layer 605 is made of aluminum nitride. Specific structures refer to FIGS. 6d and 6e.

Figure 6F:
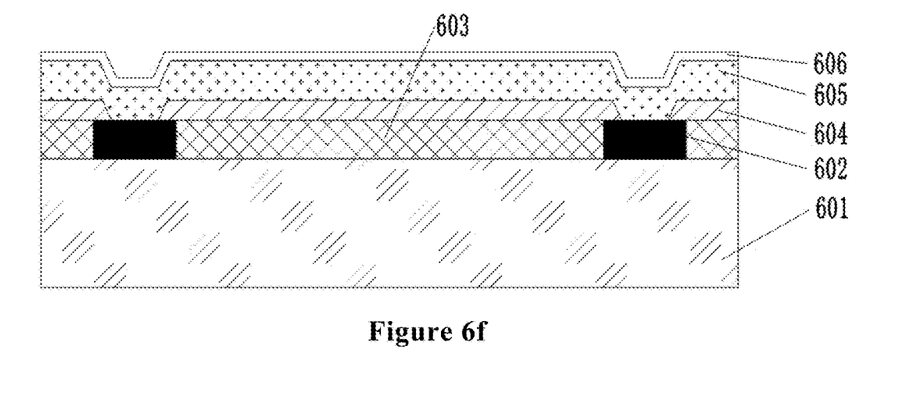
Figure 6G:
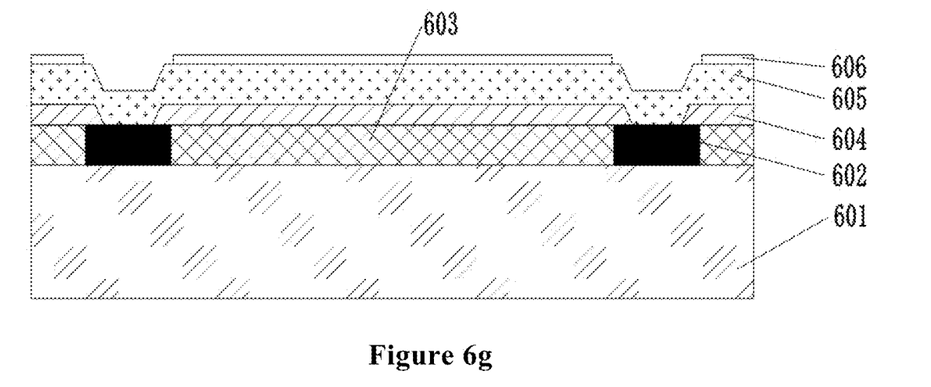

Reference is further made to FIG. 6f and FIG. 6g. A hard mask 606 is deposited on a surface of the piezoelectric layer 605 through chemical vapor deposition (CVD). The hard mask 606 is an inorganic thin film made of, for example, TiN, SiN, $SiO_2$, or the like. An opening is formed in the hard mask through photolithography and etching. A shape of the hard mask is same as that of the top electrode which is subsequently formed, and a region blocked by the hard mask is an effective region of the resonator. As an alternative solution, a photoresist may be developed to form a pattern of the opening directly (that is, the hard mask is replaced with the photoresist), which can also achieve the technical effect of embodiments of the present disclosure.

Figure 6H:
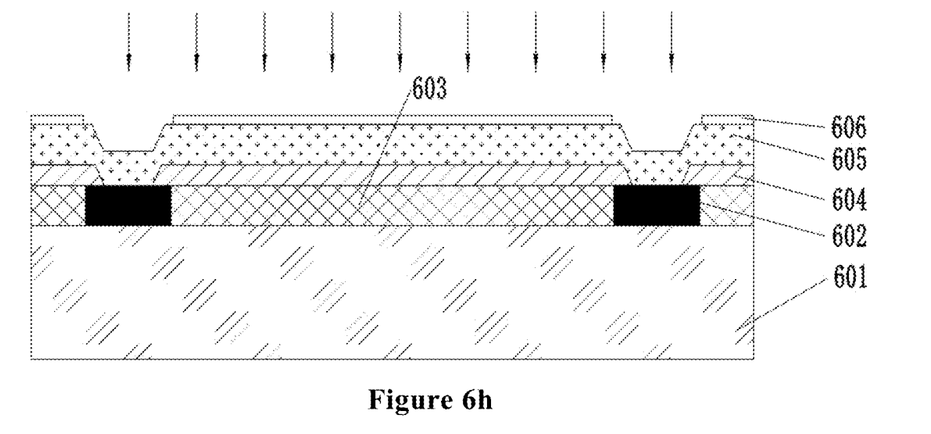
Figure 6I:
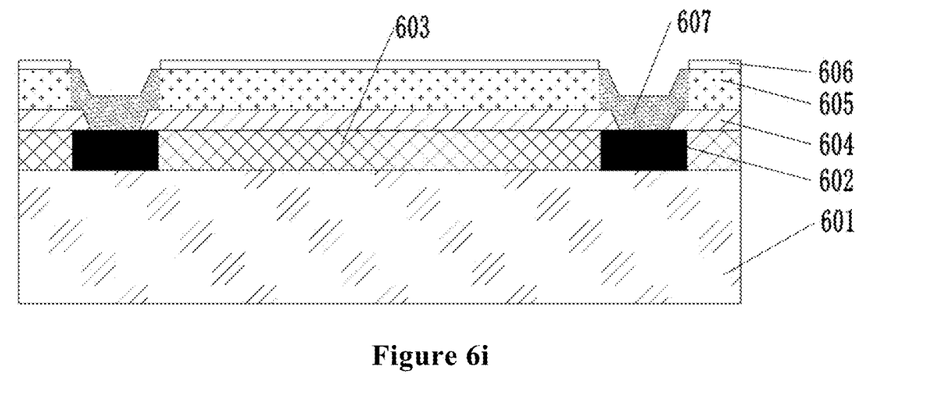

Reference is made to FIG. 6h and FIG. 6i. Ion implantation is performed on a region of the piezoelectric layer 605 exposed from the hard mask 606. Implanted atoms may be Ni, Fe, Cr, Mn, Co, V, Y, Si, or the like. The piezoelectric layer 605 is annealed after the ion implantation, and the annealing temperature should be higher than the Curie point of the material of the piezoelectric layer 605 after the ion implantation. Thereby, the ion-implanted region of the piezoelectric layer 605 forms a depolarized portion 607. In a preferable embodiment, a type and/or concentration of the implanted ions may be controlled in the ion implantation, such that the material of the piezoelectric layer after the ion implantation has a Curie point lower than the highest temperature occurring in processes which are for manufacturing the resonator and subsequent to the ion implantation.

In a specific embodiment, the piezoelectric layer 605 is subject to the ion implantation and then selective depolarization, in order to eliminate piezoelectricity of the piezoelectric layer 605. A Curie point for the piezoelectric layer 605 made of aluminum nitride is 673.15K (400° C.), which is studied as a critical point. In a case that the Curie point of the piezoelectric layer 605 is lower than 673.15K and temperatures in multiple processes subsequent to the ion implantation exceed 673.15K, the temperatures are higher than the Curie point of the piezoelectric layer 605, which leads to violent movement and thus irregular arrangement of molecules and atoms within the film of the piezoelectric layer 605. Hence, these processes having higher temperatures can eliminate the piezoelectricity of the piezoelectric layer 605. In a case that the Curie point of the piezoelectric layer 605 is higher than 673.15K and no subsequent process is under a temperature exceeding 673.15K, the piezoelectric layer 605 is further annealed as an additional process after the ion implantation, and a temperature of the annealing should be higher than the Curie point of the piezoelectric layer 605. A preferable temperature of the annealing may be 10° C. to 20° C. higher than the Curie point of the piezoelectric layer 605, and such temperature is maintained for about 0.5 h.

In a specific embodiment, the piezoelectric layer 605 may be doped with chromium. The Curie point of the piezoelectric layer 605 is slightly higher than 350K in a case that a concentration of chromium ranges from 1% to 3%, and is slightly higher than 400K in a case that the concentration of chromium is 15%. In such cases, the Curie point is lower than the foregoing critical point (673.15K), and therefore the annealing is not required. In a case that the concentration of chromium 7%, the Curie point is slightly higher than 900K. In such case, the Curie point is higher than the critical point, and hence it is necessary to anneal under a temperature higher than 900K, in order to eliminate the piezoelectricity of the depolarized portion 607.

In another specific embodiment, the piezoelectric layer 605 may be doped with vanadium. In a case that a concentration of vanadium is 1.58%, the piezoelectric layer 605 may have a Curie point of 300K, which is close to room temperature. In such case, the piezoelectricity of the depolarized portion 607 can be eliminated in subsequent processes without annealing.

Figure 6J:
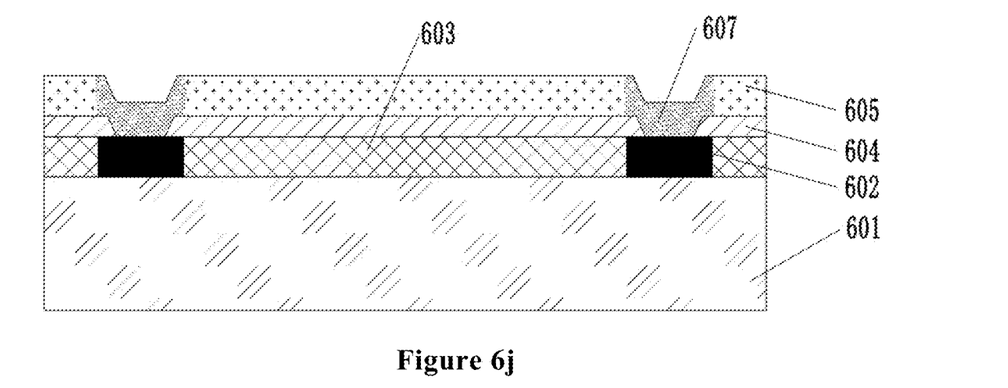

Reference is further made to FIG. 6j. The hard mask 606 is removed by using hydrofluoric acid solution. Regardless of a contour of a region having implanted ions, such region does not extend out of a region defined by the cavity. That is, a vertical projection of the region having implanted ions may partially overlap with the boundary of the cavity. Alternatively, the vertical projection may extend slightly into the cavity.

Figure 6K:
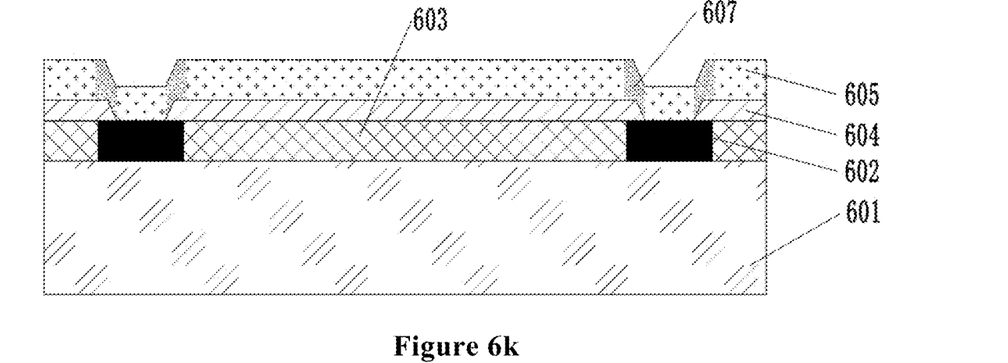
Figure 6L:
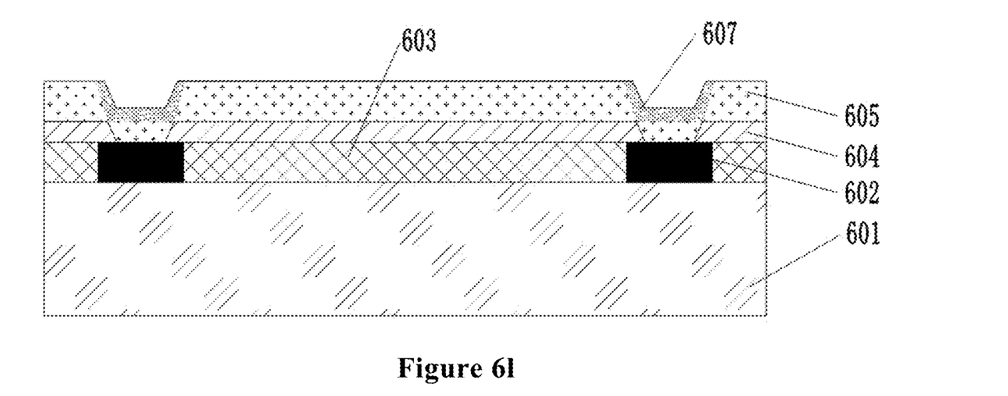

In a specific embodiment, the region having implanted ions is limited in a horizontal direction as follows. The region may be the whole region outside the cavity or the cavities (as shown in FIG. 6j) or only a part of the region outside the cavity or the cavities (as shown in FIG. 6k). The region having implanted ions is limited in a vertical direction as follows. The region may penetrate the piezoelectric layer (as shown in FIG. 6j) or be partially implemented (as shown in FIG. 6l). A range along the horizontal direction may be tuned by adjusting a contour of the pattern for the opening in the hard mask 606, and a range along the vertical direction may be tuned by adjusting a parameter of the ion implantation. A larger region having implanted ions can improve device performances more greatly while increasing a cost. Therefore, an appropriate region for ion implantation may be determined based on a balance between a requirement on the cost and a requirement on device performances.

Figure 6M:
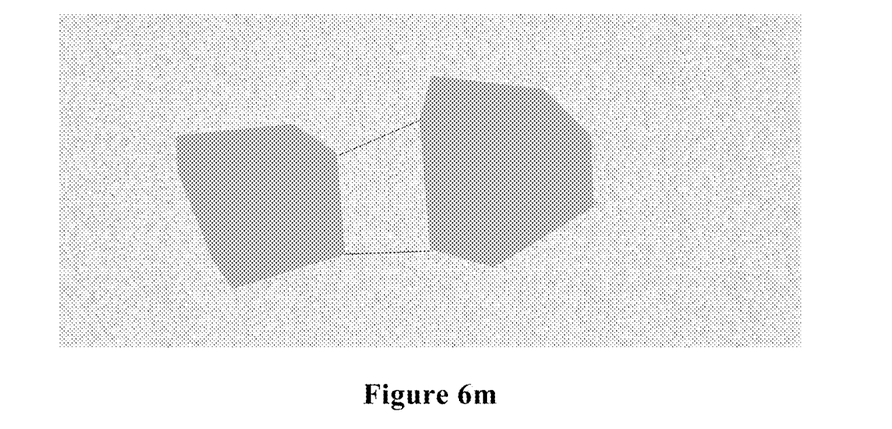

In another specific embodiment, the ion implantation may be performed on the whole non-resonating region to eliminate the piezoelectricity of the piezoelectric layer 605. The piezoelectricity of the piezoelectric layer 605 is only retained within the resonating region to achieve functions of the device. Thereby, maximum isolation and a minimum parasitic effect are realized. As shown in FIG. 6m, all regions are doped except a part of the piezoelectric layer 605 corresponding to the top electrode 608.

In a preferable embodiment, the doped region is determined to achieve a depolarized portion, which is capable of suppressing parasitic oscillation on requirement, at a minimum cost. The doped region in the piezoelectric layer 605 may be arbitrarily configured with respect to its position among the resonators, its area, its depth, and its position outside the resonators.

Figure 6N:
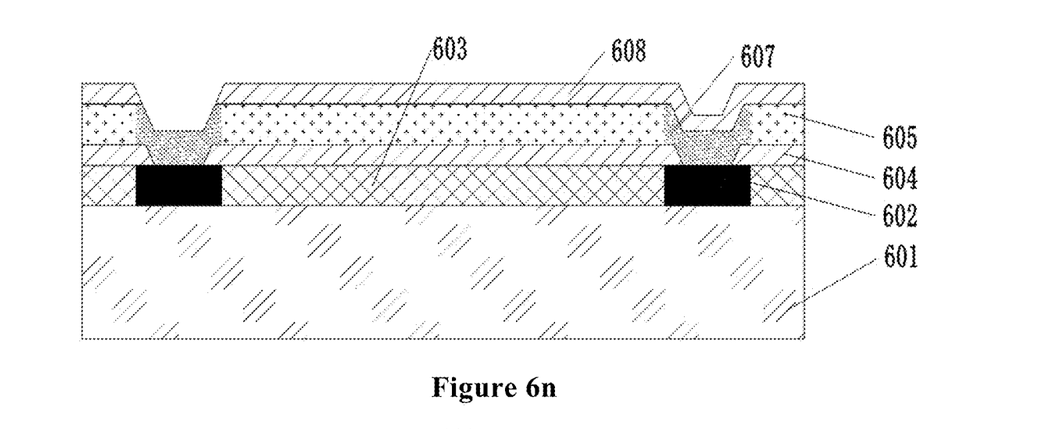
Figure 6O:
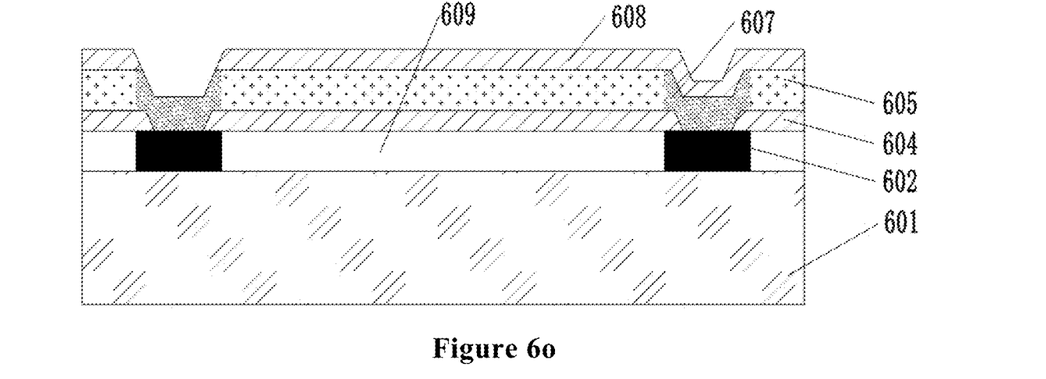

Reference is made to FIG. 6n and FIG. 6o. A top electrode 608 is provided on a surface of the piezoelectric layer 605, and the top electrode 608 is made of molybdenum. The sacrificial layer 603 is removed by using a hydrofluoric acid etchant to obtain a cavity 609. Thereby, a process of manufacturing the thin film bulk acoustic resonator is completed.

In such process, the piezoelectric layer to be depolarized is exposed through depositing the hard mask 606, and selective depolarization can be adopted on the piezoelectric layer 605 through the ion implantation to eliminate the piezoelectricity of a part of the piezoelectric layer. The region for the ion implantation may be determined based on both the cost and device performances, and hence the process is applicable to various techniques for manufacturing thin film bulk acoustic resonators.

The thin film bulk acoustic resonators manufactured through the method as shown in FIG. 6a to FIG. 6o utilizes depolarized piezoelectric layer at a specific area or a specific depth. In a case that an electric field is applied between the top electrode and the bottom electrode, the piezoelectric layer converts electrical energy into mechanical energy which is in a transverse-wave vibration mode and a longitudinal-wave vibration mode. The depolarized region can restrain the energy in the resonating region above the cavity of the resonator from dissipating via transverse waves. Hence, an intensity of mechanical vibration in the resonating region is ensured, and the Q factor of the resonator is improved.

Hereinabove described are specific embodiments of the present disclosure. The protection scope of the present disclosure is not limited by the embodiments. Any modification or substitution that can be easily envisaged by those skilled in the art within the technical scope disclosed in the present disclosure shall fall within the protection scope of the present disclosure. Therefore, the protection scope of the present disclosure shall be subject to the protection scope defined in the claims.

It should be understood that in the description of the present disclosure, orientations or positional relationships indicated by the terms "upper", "lower", "inside", "outside", and the like, are based on the drawings. These terms are merely intended for facilitating describing the present disclosure and simplifying the description, rather than indicating or implying that devices or elements defined by the terms must comply with the designated orientation, or must be constructed and operated according to the designated orientation. Therefore, such terms should not be construed as a limitation to the present disclosure. The word "comprising (including)" does not exclude presence of elements or steps not listed in a claim. The article 'a' or 'an' preceding an element does not exclude that there are multiple such elements. The mere fact that certain measures are recited in different dependent claims does not indicate that a combination of these measures cannot be utilized for improvement. Any reference sign in the claims should not be construed as a limitation.

INDUSTRIAL APPLICABILITY

In embodiments of the present disclosure, the piezoelectric layer in a specific region is depolarized and therefore has no piezoelectricity, which can suppress parasitic oscillation, restrain energy from dissipating via transverse waves. Hence, the Q factor and the device performances are improved. The manufacturing is simple, has a low cost, and is applicable to large-scale industrial production.

The invention claimed is:

1. A thin film bulk acoustic wave resonator, comprising:
a bottom electrode layer, a piezoelectric layer, and a top electrode layer, which form a stack covering an acoustic reflection structure located at a surface of a substrate, wherein:
a portion of the piezoelectric layer and is depolarized to form a depolarized portion of which piezoelectricity is eliminated; and
along a direction perpendicular to the substrate, a projection of a part of the depolarized portion on the substrate is:
located outside of a projection of the acoustic reflection structure on the substrate,
located inside of a projection of the top electrode layer on the substrate, and
located inside of a projection of the bottom electrode layer on the substrate.

2. The thin film bulk acoustic resonator according to claim 1, wherein the depolarized portion is partially depolarized.

3. The thin film bulk acoustic resonator according to claim 1, wherein the depolarized portion is completely depolarized.

4. The thin film bulk acoustic resonator according to claim 1, wherein the depolarized portion is formed through selective depolarization on the piezoelectric layer.

5. The thin film bulk acoustic resonator according to claim 4, wherein the depolarization comprises ion implantation and annealing which are performed on a piezoelectric material of the piezoelectric layer.

6. The thin film bulk acoustic resonator according to claim 1, comprising a plurality of sub-resonators disposed on the same substrate, wherein the piezoelectric layer in a region between adjacent ones of the plurality of sub-resonators is depolarized.

7. The thin film bulk acoustic resonator according to claim 1, wherein the acoustic reflection structure is a cavity.

8. The thin film bulk acoustic resonator according to claim 1, wherein the acoustic reflection structure is a Bragg reflection structure.

9. A method for manufacturing a thin film bulk acoustic wave resonator, comprising:
providing a stack covering an acoustic reflection structure located at a surface of a substrate, wherein the stack comprises a bottom electrode layer, a piezoelectric layer, and a top electrode layer, wherein:
a portion of the piezoelectric layer is depolarized to form a depolarized portion of which piezoelectricity is eliminated; and
along a direction perpendicular to the substrate, a projection of a part of the depolarized portion on the substrate is:
located outside of a projection of the acoustic reflection structure on the substrate,
located inside of a projection of the top electrode layer on the substrate, and
located inside of a projection of the bottom electrode layer on the substrate.

10. The method according to claim 9, wherein providing the stack covering the acoustic reflection structure located at the surface of the substrate comprises:
providing bottom electrode layer on the substrate;
providing the piezoelectric layer on the bottom electrode layer;
depolarizing the portion of the piezoelectric layer to form the depolarized portion; and
providing the top electrode layer on the piezoelectric layer;
wherein depolarizing the portion of the piezoelectric layer comprises:
depositing a hard mask or coating a photoresist on the piezoelectric layer;
patterning the hard mask or the photoresist to expose at least the portion of the piezoelectric layer;

performing ion implantation on the exposed portion of the piezoelectric layer; and removing the hard mask or the photoresist.

11. The method according to claim 10, wherein performing the ion implantation on the exposed portion of the piezoelectric layer further comprises:

annealing the piezoelectric layer after the ion implantation.

12. The method according to claim 10, wherein performing the ion implantation on the exposed portion of the piezoelectric layer comprises:

controlling one or both of a type and concentration of ions implanted during the ion implantation, wherein a Curie point of a material of the piezoelectric layer after the ion implantation is lower than a highest temperature in all processes which are for manufacturing the resonator and subsequent to the ion implantation.

13. The method according to claim 9, wherein the acoustic reflection structure is a cavity or a Bragg reflection structure.

14. A thin film bulk acoustic wave resonator, wherein:

the thin film bulk acoustic wave resonator is manufactured through the method according to claim 9.

15. The thin film bulk acoustic resonator according to claim 1, wherein along the direction perpendicular to the substrate, a projection of another part of the depolarized portion on the substrate is:

located inside of the projection of the acoustic reflection structure on the substrate, located inside of the projection of the top electrode layer on the substrate, and located inside of the projection of the bottom electrode layer on the substrate.

16. The thin film bulk acoustic resonator according to claim 1, wherein along the direction perpendicular to the substrate, a projection of the part of the depolarized portion on the substrate and a projection of the projection of the bottom electrode layer share a same boundary.

* * * * *